United States Patent
Maetani et al.

(10) Patent No.: US 9,425,789 B1
(45) Date of Patent: Aug. 23, 2016

(54) REFERENCE VOLTAGE CIRCUIT AND ELECTRONIC DEVICE

(71) Applicant: SII Semiconductor Corporation, Chiba-shi, Chiba (JP)

(72) Inventors: Fumihiko Maetani, Chiba (JP); Toshiyuki Koike, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/049,994

(22) Filed: Feb. 22, 2016

(30) Foreign Application Priority Data

Feb. 26, 2015 (JP) .................................. 2015-037332

(51) Int. Cl.
| | |
|---|---|
| G05F 1/10 | (2006.01) |
| H03K 3/42 | (2006.01) |
| H03K 17/687 | (2006.01) |
| G05F 3/00 | (2006.01) |
| G11C 5/14 | (2006.01) |
| G05F 3/02 | (2006.01) |

(52) U.S. Cl.
CPC ................ *H03K 17/687* (2013.01); *G05F 3/00* (2013.01); *G11C 5/143* (2013.01); *G11C 5/147* (2013.01); *G05F 3/02* (2013.01)

(58) Field of Classification Search
CPC ............. G05F 3/16; G05F 3/185; G05F 3/00; G05F 3/02; G11C 5/143; G11C 5/147
USPC .................................. 327/333, 530, 539–544
See application file for complete search history.

(56) References Cited

U.S. PATENT DOCUMENTS

| | | | | |
|---|---|---|---|---|
| 5,432,432 A | * | 7/1995 | Kimura .................... | G05F 3/245 323/313 |
| 7,030,686 B2 | * | 4/2006 | Itoh ......................... | G05F 1/575 323/316 |
| 7,479,821 B2 | | 1/2009 | Imura | |
| 8,188,785 B2 | * | 5/2012 | Iacob ........................ | G05F 1/10 327/543 |
| 8,373,501 B2 | * | 2/2013 | Suzuki ...................... | G05F 3/24 327/541 |

\* cited by examiner

*Primary Examiner* — Dinh T Le
(74) *Attorney, Agent, or Firm* — Brinks Gilson & Lione

(57) ABSTRACT

Provided is a reference voltage circuit capable of forming optimal circuits for various modes of an electronic device. The reference voltage circuit includes, between respective transistors forming the reference voltage circuit and between the transistors and a power supply terminal, switching elements configured to switch a circuit configuration of the reference voltage circuit.

6 Claims, 3 Drawing Sheets

REFERENCE VOLTAGE CIRCUIT AND ELECTRONIC DEVICE

RELATED APPLICATIONS

This application claims priority under 35 U.S.C. §119 to Japanese Patent Application No. 2015-037332 filed on Feb. 26, 2015, the entire content of which is hereby incorporated by reference.

BACKGROUND OF THE INVENTION

1. Field of the Invention

The present invention relates to a semiconductor device configured to output a constant reference voltage.

2. Description of the Related Art

As a reference voltage circuit capable of outputting a stable voltage even with power supply voltage fluctuations and temperature fluctuations, for example, a circuit illustrated in FIG. 3 has hitherto been used (see Japanese Patent Application Laid-open No. 2007-266715).

A related-art reference voltage circuit 503 includes an N-type depletion MOS transistor 51, an N-type depletion MOS transistor 56, an N-type enhancement MOS transistor 52, and a resistor group 58.

However, the related art has a problem in that, in an electronic device having an operation mode supposed to suppress current consumption of the reference voltage circuit, an operation mode required to output a precise and stable reference voltage, and other operation modes, the current consumption of the reference voltage circuit cannot be reduced.

SUMMARY OF THE INVENTION

The present invention has been conceived in order to solve the problem described above, and provides a reference voltage circuit capable of switching a circuit configuration depending on operation modes such as a normal operation mode and a low current consumption operation mode.

In order to solve the related-art problem, a reference voltage circuit according to one embodiment of the present invention has the following configuration.

The reference voltage circuit includes, between respective transistors forming the reference voltage circuit and between the transistors and a power supply terminal, switching elements configured to switch a circuit configuration of the reference voltage circuit.

According to the reference voltage circuit of the one embodiment of the present invention, in an electronic device having an operation mode supposed to suppress current consumption of the reference voltage circuit, an operation mode required to output a precise and stable reference voltage, and other operation modes, the reference voltage circuit can have optimal configurations for the respective modes.

DETAILED DESCRIPTION OF THE PREFERRED EMBODIMENTS

Figure 1:
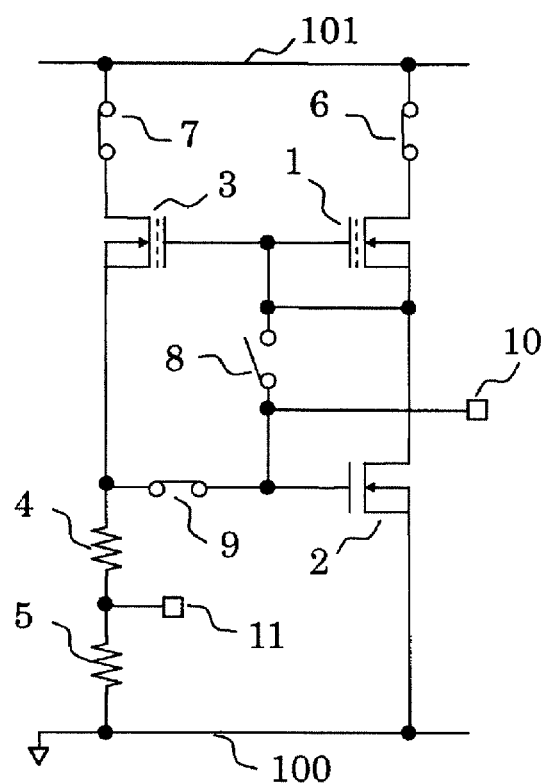
FIG. 1 is a circuit diagram for illustrating a reference voltage circuit according to an embodiment of the present invention.

FIG. 1 is a circuit diagram for illustrating a reference voltage circuit according to an embodiment of the present invention.

The reference voltage circuit of this embodiment includes a first power line 101, a second power line 100, a reference voltage output terminal 10, a reference voltage output terminal 11, an N-type depletion MOS transistor 1, an N-type depletion MOS transistor 3, an N-type enhancement MOS transistor 2, a resistor 4, a resistor 5, a switching element 6, a switching element 7, a switching element 8, and a switching element 9.

The first power line 101 is connected to a first terminal of the switching element 6 and a first terminal of the switching element 7. The N-type depletion MOS transistor 1 has a drain connected to a second terminal of the switching element 6, and a gate, a source, and a back gate connected to a first terminal of the switching element 8. The N-type enhancement MOS transistor 2 has a drain connected to the first terminal of the switching element 8, a gate connected to a second terminal of the switching element 8, a second terminal of the switching element 9, and the reference voltage output terminal 10, and a source and a back gate connected to the second power line 100. The N-type depletion MOS transistor 3 has a drain connected to a second terminal of the switching element 7, a gate connected to the first terminal of the switching element 8, and a source and a back gate connected to a first terminal of the switching element 9 and a first terminal of the resistor 4. A second terminal of the resistor 4 is connected to the reference voltage output terminal 11 and a first terminal of the resistor 5. A second terminal of the resistor 5 is connected to the second power line 100.

Operation of the reference voltage circuit of this embodiment is described. The resistor 4 and the resistor 5 form a resistor circuit configured to output a voltage obtained through division of voltage at a ratio between the resistor 4 and the resistor 5.

FIG. 1 is a circuit diagram for illustrating the reference voltage circuit in a normal operation mode.

In the normal operation mode, the switching element 6 is short-circuited, the switching element 7 is short-circuited, the switching element 8 is open-circuited, and the switching element 9 is short-circuited. In the normal operation mode, a precise and stable reference voltage is required and current consumption is not required to be low.

In this case, the same current as a current flowing through the N-type depletion MOS transistor 1 flows through the N-type enhancement MOS transistor 2, and hence a reference voltage VREF1 of the reference voltage output terminal 10 is expressed by Expression 1 when a threshold voltage of the N-type depletion MOS transistor 1 is represented by VTH1 and a K value thereof is represented by K1, and a threshold voltage of the N-type enhancement MOS transistor 2 is represented by VTH2 and a K value thereof is represented by K2.

$$VREF1 = \sqrt{(K1/K2)} \times |VTH1| + VTH2 \quad (1)$$

Further, to the reference voltage output terminal 11, a voltage is output that is obtained through division of the reference voltage VREF1 by the resistor 4 and the resistor 5. The ratio between the resistor 4 and the resistor 5 can be changed, and hence a voltage to be output to the reference voltage output terminal 11 can be set to any value as long as the voltage is a voltage between a value of the reference voltage VREF1 and a voltage of the second power line 100.

Further, when sizes of the N-type depletion MOS transistor 1 and the N-type enhancement MOS transistor 2 are adjusted so that K1 and K2 may be the same, temperature characteristics of the reference voltage circuit is improved, thereby being capable of realizing a reference voltage circuit with higher precision.

Figure 2:
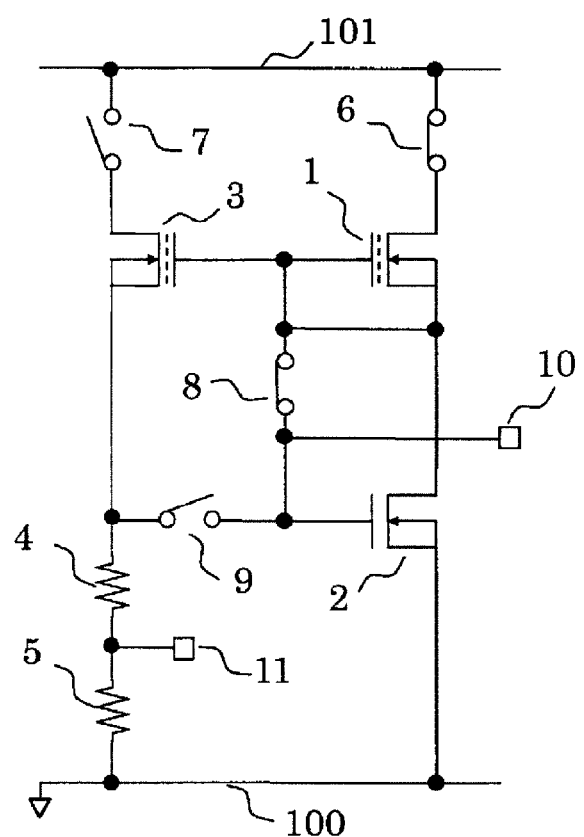
FIG. 2 is a circuit diagram for illustrating the reference voltage circuit of this embodiment in a low current consumption operation mode.
Figure 3:
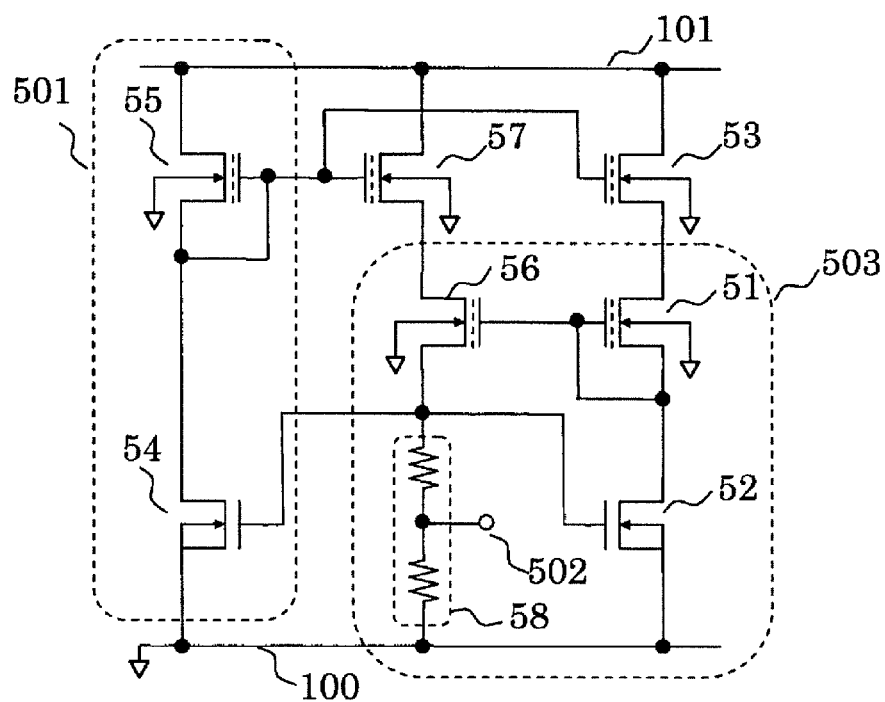
FIG. 3 is a circuit diagram for illustrating an example of a configuration of a related-art reference voltage circuit.

FIG. 2 is a circuit diagram for illustrating the reference voltage circuit in a low current consumption operation mode.

In the low current consumption operation mode, the switching element 6 is short-circuited, the switching element 7 is open-circuited, the switching element 8 is short-circuited, and the switching element 9 is open-circuited. Through the control of the switching elements as described above, a simple ED type reference voltage circuit can be formed. In the low current consumption operation mode, the reference voltage circuit is required to be low in current consumption.

The same current as the current flowing through the N-type depletion MOS transistor 1 flows through the N-type enhancement MOS transistor 2, and hence a voltage to be output to the reference voltage output terminal 10 is an output voltage having the same value as that described in the first embodiment.

The switching element 7 is open-circuited, and hence the reference voltage output terminal 11 has the same potential as that of the second power line 100. Further, the switching element 7 is open-circuited, and hence a current flowing through the N-type depletion MOS transistor 2, the resistor 4, and the resistor 5 can be blocked. Consequently, the current consumption can be reduced more than in the reference voltage circuit of FIG. 1.

When the current consumption of the reference voltage circuit needs to be reduced, the reference voltage circuit is used under a state in which a circuit to which the reference voltage output terminal 11 is connected is not necessarily used, thereby being capable of reducing the current consumption of the entire reference voltage circuit.

Note that, although not illustrated, a mode as described below can be realized with a combination of open-circuiting and short-circuiting of the respective switching elements.

For example, the switching element 6 is open-circuited and the switching element 7 is open-circuited so that the reference voltage circuit can enter a sleep mode or a power down mode in which a current flowing through the circuit is completely blocked.

With the reference voltage circuit formed as described above, through switching of the respective switching elements, it is possible to attain the configurations of the reference voltage circuit for the normal operation mode required to output a precise and stable reference voltage, the low current consumption operation mode required to reduce current consumption, and other operation modes.

Note that, according to the embodiment of the present invention, when gates having different polarities are employed as the gates of the N-type depletion MOS transistor 1 and the N-type enhancement MOS transistor 2, the temperature characteristics are further improved, thereby being capable of providing a highly precise reference voltage circuit.

What is claimed is:

1. A reference voltage circuit connected between a first power line and a second power line, the reference voltage circuit comprising:
   a first switching element including one terminal connected to the first power line;
   a first N-type depletion MOS transistor including a gate and a source connected to each other, and a drain connected to another terminal of the first switching element;
   a first N-type enhancement MOS transistor including a gate connected to an output terminal of the reference voltage circuit, a drain connected to the source of the first N-type depletion MOS transistor, and a source connected to the second power line;
   a second switching element connected between the gate of the first N-type depletion MOS transistor and the gate of the first N-type enhancement MOS transistor;
   a third switching element including one terminal connected to the first power line;
   a second N-type depletion MOS transistor including a gate connected to the gate of the first N-type depletion MOS transistor, and a drain connected to another terminal of the third switching element;
   a resistor circuit connected between a source of the second N-type depletion MOS transistor and the second power line; and
   a fourth switching element connected between the source of the second N-type depletion MOS transistor and the gate of the first N-type enhancement MOS transistor.

2. A reference voltage circuit according to claim 1, wherein the reference voltage circuit is configured to operate, in a first operation state, to:
   short-circuit the first switching element;
   open-circuit the second switching element;
   short-circuit the third switching element; and
   short-circuit the fourth switching element.

3. A reference voltage circuit according to claim 1, wherein the reference voltage circuit is configured to operate, in a second operation state, to:
   short-circuit the first switching element;
   short-circuit the second switching element;
   open-circuit the third switching element; and
   open-circuit the fourth switching element.

4. A reference voltage circuit according to claim 1, wherein the reference voltage circuit is configured to operate, in a third operation state, to:
   open-circuit the first switching element; and
   open-circuit the second switching element.

5. A reference voltage circuit according to claim 1, wherein the first N-type depletion MOS transistor and the first N-type enhancement MOS transistor include gates having different polarities.

6. An electronic device, comprising the reference voltage circuit of claim 1.

* * * * *